United States Patent
Lin et al.

(10) Patent No.: US 10,804,141 B2
(45) Date of Patent: Oct. 13, 2020

(54) DAMASCENE PLUG AND TAB PATTERNING WITH PHOTOBUCKETS FOR BACK END OF LINE (BEOL) SPACER-BASED INTERCONNECTS

(71) Applicant: Intel Corporation, Santa Clara, CA (US)

(72) Inventors: Kevin Lin, Beaverton, OR (US); Robert L. Bristol, Portland, OR (US); Richard E. Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/092,722

(22) PCT Filed: May 27, 2016

(86) PCT No.: PCT/US2016/034617
§ 371 (c)(1),
(2) Date: Oct. 10, 2018

(87) PCT Pub. No.: WO2017/204820
PCT Pub. Date: Nov. 30, 2017

(65) Prior Publication Data
US 2019/0164815 A1 May 30, 2019

(51) Int. Cl.
*H01L 21/768* (2006.01)
*H01L 21/033* (2006.01)
*H01L 23/528* (2006.01)

(52) U.S. Cl.
CPC .... *H01L 21/76816* (2013.01); *H01L 21/0334* (2013.01); *H01L 21/7682* (2013.01); *H01L 21/76877* (2013.01); *H01L 23/528* (2013.01)

(58) Field of Classification Search
None
See application file for complete search history.

(56) References Cited

U.S. PATENT DOCUMENTS

| | | | |
|---|---|---|---|
| 9,041,217 B1 * | 5/2015 | Bristol | H01L 23/528 |
| | | | 257/774 |
| 2004/0016964 A1 | 1/2004 | Kim et al. | |
| 2014/0206186 A1 | 7/2014 | Lee et al. | |
| 2015/0171010 A1 | 6/2015 | Bristol et al. | |
| 2015/0179513 A1 | 6/2015 | Myers et al. | |
| 2015/0229208 A1 * | 8/2015 | Kim | H01L 28/87 |
| | | | 257/299 |
| 2015/0303107 A1 | 10/2015 | Eom | |

OTHER PUBLICATIONS

International Search Report and Written Opinion for International Patent Application No. PCT/US2016/034617 dated, Feb. 20, 2017, 11 pgs.

* cited by examiner

*Primary Examiner* — Sonya McCall-Shepard
(74) *Attorney, Agent, or Firm* — Schwabe, Williamson & Wyatt, P.C.

(57) ABSTRACT

Damascene plug and tab patterning with photobuckets for back end of line (BEOL) spacer-based interconnects is described. In an example, a back end of line (BEOL) metallization layer for a semiconductor structure includes an inter-layer dielectric (ILD) layer disposed above a substrate. A plurality of conductive lines is disposed in the ILD layer along a first direction. A conductive tab is disposed in the ILD layer. The conductive tab couples two of the plurality of conductive lines along a second direction orthogonal to the first direction.

20 Claims, 14 Drawing Sheets

DAMASCENE PLUG AND TAB PATTERNING WITH PHOTOBUCKETS FOR BACK END OF LINE (BEOL) SPACER-BASED INTERCONNECTS

CROSS-REFERENCE TO RELATED APPLICATION

This patent application is a U.S. National Phase Application under 35 U.S.C. § 371 of International Application No. PCT/US2016/034617, filed May 27, 2016, entitled "DAMASCENE PLUG AND TAB PATTERNING WITH PHOTOBUCKETS FOR BACK END OF LINE (BEOL) SPACER-BASED INTERCONNECTS," which designates the United States of America, the entire disclosure of which is hereby incorporated by reference in its entirety and for all purposes.

TECHNICAL FIELD

Embodiments of the invention are in the field of semiconductor structures and processing and, in particular, damascene plug and tab patterning with photobuckets for back end of line (BEOL) spacer-based interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70-90 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners. The above factors are also relevant for considering placement and scaling of dielectric plugs or metal line ends among the metal lines of back end of line (BEOL) metal interconnect structures.

Thus, improvements are needed in the area of back end metallization manufacturing technologies for fabricating metal lines, metal vias, and dielectric plugs.

DESCRIPTION OF THE EMBODIMENTS

Figure 1A:
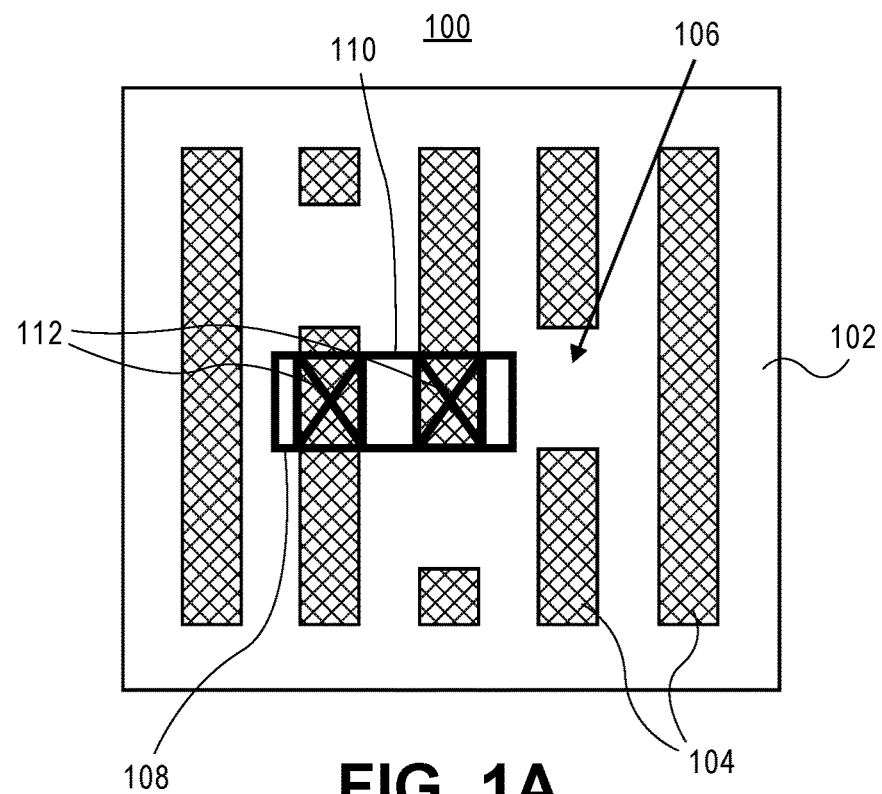
FIG. 1A illustrates a plan view of a conventional back end of line (BEOL) metallization layer.

Damascene plug and tab patterning with photobuckets for back end of line (BEOL) spacer-based interconnects is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to photobucket approaches for damascene plug and tab patterning. Such patterning schemes may be implemented to enable bi-directional spacer-based interconnects. Implementations may be particularly suitable for electrically connecting two parallel lines of a metallization layer where the two metal lines were fabricated using a spacer-based approach which otherwise may restrict the inclusion of conductive connection between two adjacent lines in a same metallization layer.

In general, one or more embodiments are directed to an approach that employs a damascene technique to form conductive tabs and non-conductive spaces or interruptions between metals (referred to as "plugs"). Conductive tabs, by definition, are conductive linkers between two conductive metal lines, such as between two parallel conductive lines. The tabs are typically in a same layer as the metal lines. The processing schemes may also be suitable for conductive via fabrication. Vias, by definition, are used to land on a previous layer metal pattern.

More specifically, one or more embodiment described herein involves the use of a damascene method to form tabs and plugs. Initially, every possible tab and plug location is first patterning in a hardmask layer. An additional operation is then used to select which of the tab and plug locations to retain. The locations are then transferred into an underlying inter-layer dielectric layer. Such operations can be illustrated using "photobuckets." In a particular embodiment, a method for damascene patterning of vias, plugs, and tabs with is provided with self-alignment using a photobucketing approach and selective hard masks. Embodiments described herein may be contrasted against state-of-the-art solutions for subtractive interconnect patterning which are typically associated with one or more of the following disadvantages: (1) there is no self-alignment between plugs and vias with the interconnect lines, (2) due to spacer-based patterning, tight-pitched interconnects only run in one direction, or (3) in order to connect two adjacent interconnects, a metal line above or below the metal line is typically used.

By way of example, FIG. 1A illustrates a plan view of a conventional back end of line (BEOL) metallization layer. Referring to FIG. 1A, a conventional BEOL metallization layer 100 is shown with conductive lines or routing 104 disposed in an inter-layer dielectric layer 102. The metal lines may generally run parallel to one another and may include cuts, breaks or plugs 106 in the continuity of one or more of the conductive lines 104. In order to electrically couple two or more of the parallel metal lines, upper or lower layer routing 108 is included in a previous or next metallization layer. Such upper or lower layer routing 108 may include a conductive line 110 coupling conductive vias 112. It is to be appreciated that, since the upper or lower layer routing 108 is included in a previous or next metallization layer, the upper or lower layer routing 108 can consume vertical real estate of a semiconductor structure that includes the metallization layers.

Figure 1B:
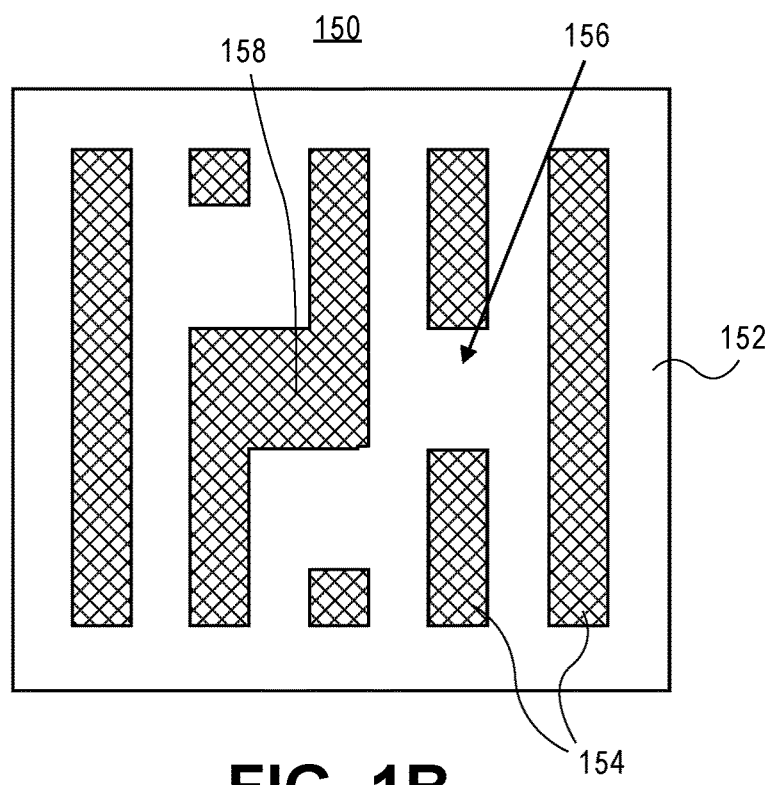
FIG. 1B illustrates a plan view of a back end of line (BEOL) metallization layer having a conductive tab coupling metal lines of the metallization layer, in accordance with an embodiment of the present invention.

By contrast, FIG. 1B illustrates a plan view of a back end of line (BEOL) metallization layer having a conductive tab coupling metal lines of the metallization layer, in accordance with an embodiment of the present invention. Referring to FIG. 1B, a BEOL metallization layer 150 is shown with conductive lines or routing 154 disposed in an inter-layer dielectric layer 152. The metal lines may generally run parallel to one another and may include cuts, breaks or plugs 156 in the continuity of one or more of the conductive lines 154. In order to electrically couple two or more of the parallel metal lines, a conductive tab 158 is included in the metallization layer 150. It is to be appreciated that, since the conductive tab 158 is included in the same metallization layer as the conductive lines 154, the conductive tab 158 consumption of vertical real estate of a semiconductor structure that includes the metallization layer can be reduced relative to the structure of FIG. 1A.

In accordance with an embodiment of the present invention, photobucket patterning is used for fabricating plugs and tabs in a self-aligned manner. A general overview process flow can involve (1) fabrication of a cross-grating, followed by (2) photobucketing for plug definition and changing the photoresist to a "hard" material that can withstand downstream processing, followed by (3) grating tone reversal by backfilling with a fillable material, recessing the fillable material, and removing the original cross-grating, followed by (4) photobucketing for "Tab" definition, followed by (5) etch transferring the pattern into an underlying inter-layer dielectric (ILD) layer and polishing away the additional hard mask materials. It is to be appreciated that although the general process flow does not include vias, in an embodiment, approaches described herein can be implemented to extend to multiple passes of plugs, vias, and tabs using a same self-aligned grating.

Providing a general processing scheme, FIGS. 2A-2E illustrate angled cross-sectional views representing various operations in a method of fabricating a back end of line (BEOL) metallization layer having a conductive tab coupling metal lines of the metallization layer, in accordance with an embodiment of the present invention.

Figure 2A:
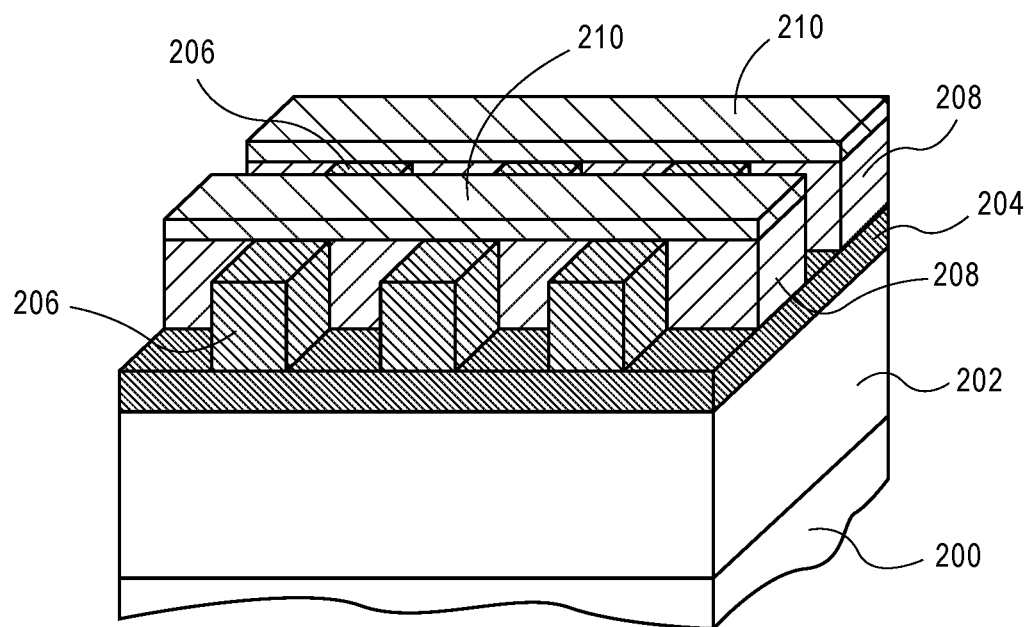
FIGS. 2A-2E illustrate angled cross-sectional views representing various operations in a method of fabricating a back end of line (BEOL) metallization layer having a conductive tab coupling metal lines of the metallization layer, in accordance with an embodiment of the present invention.

Referring to FIG. 2A, a cross-grating patterning scheme is performed above an inter-layer dielectric (ILD) layer 202 formed above a substrate 200. A blanket hardmask 204 is first formed on the ILD layer 202. A first grating hardmask 206 is formed along a first direction above the blanket hardmask 204. A second grating hardmask 208 is formed along a second direction above the blanket hardmask 204. The second direction is orthogonal to the first direction. The second grating hardmask 208 has an overlying hardmask 210 thereon. In an embodiment, the second grating hardmask 210 is patterned using the overlying hardmask 210. The continuity of the second grating hardmask 208 is broken by lines of the first grating hardmask 206 and, as such, portions of the first grating hardmask 206 extend under the overlying hardmask 210.

In an embodiment, the first grating hardmask 206 is formed with a grating pattern, as is depicted in FIG. 2A. In an embodiment, the grating structure of the first grating hardmask 206 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the first grating hardmask 206 of FIG. 2A may have hardmask lines tightly spaced at a constant pitch and having a constant width.

In an embodiment, the second grating hardmask 208 is formed interleaved with the first grating hardmask 206. In one such embodiment, the second grating hardmask 208 is formed by deposition of a second hardmask material layer having a composition different from the first grating hardmask 206. The second hardmask material layer is then planarized, e.g., by chemical mechanical polishing (CMP) or etch back processing, and then patterned using the overlying hardmask 210 to provide the second grating hardmask 208. As was the case for the first grating hardmask 206, in an embodiment, the grating structure of the second grating hardmask 208 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second grating hardmask 208 of FIG. 2A may have hardmask lines tightly spaced at a constant pitch and having a constant width.

Figure 2B:
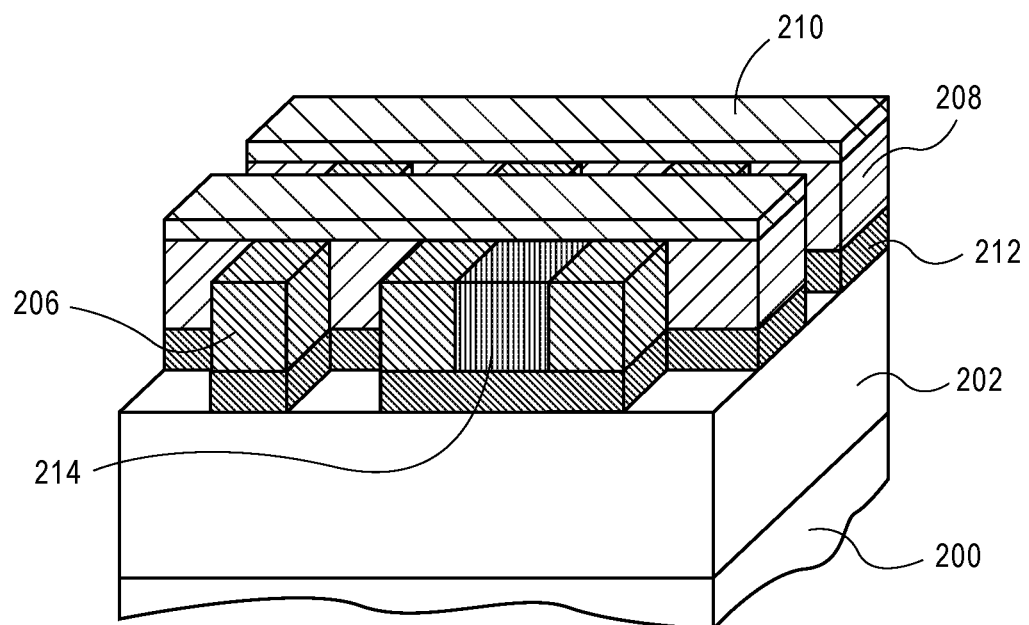

Referring to FIG. 2B, a plug photobucket patterning scheme is performed as a first photobucketing process. In an embodiment, photobuckets are formed on all of the exposed openings between the first grating hardmask 206 and the second grating hardmask 208. Select ones of the photobuckets are removed while other photobuckets 214 are retained, e.g., by not exposing photobucket 214 to a lithography and development process used to open all other photobuckets. The exposed portions of the blanket hardmask 204 of FIG. 2A are then etched to provide first-time patterned hardmask 212. The retained photobuckets 214, at this stage, represent the plug locations in a final metallization layer. That is, in the first photobucket process, photobuckets are removed from locations where plugs will not be formed. In one embodiment, in order to form locations where plugs will not be formed, lithography is used to expose the corresponding photobuckets. The exposed photobuckets may then be removed by a developer.

Figure 2C:
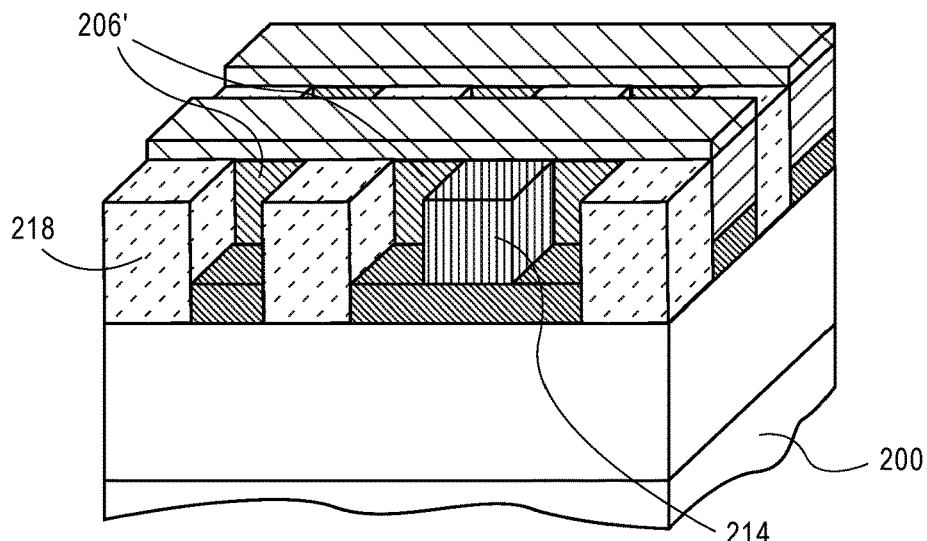

Referring to FIG. 2C, a grating tone reversal process is performed. In an embodiment, a dielectric layer 218 is formed in all of the exposed regions of the structure of FIG. 2B. Subsequently, the portions of the first grating hardmask 206 not covered by the overlying hardmask 210 are removed to leave only portions 206' of the first grating hardmask 206 remaining under the overlying hardmask 210.

Figure 2D:
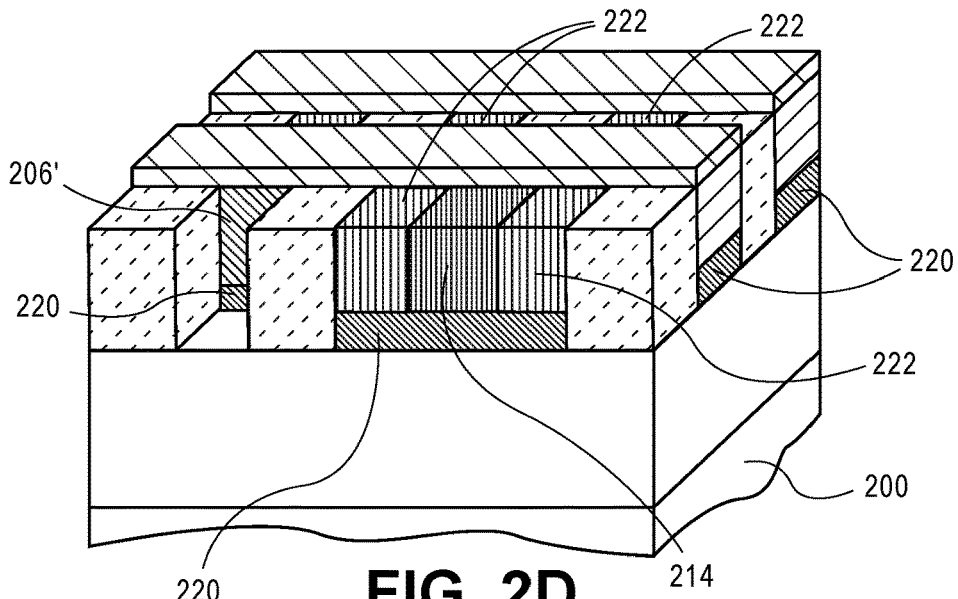

Referring to FIG. 2D, a tab photobucket patterning scheme is performed as a second photobucketing process. In an embodiment, photobuckets are formed on all of the exposed openings formed upon removal of exposed portions of the first grating hardmask 206. Select ones of the photobuckets are removed while other photobuckets 222 are retained, e.g., by not exposing photobuckets 222 to a lithography and development process used to open the other photobuckets. The exposed portions of the first-time patterned hardmask 212 of FIGS. 2B and 2C are then etched to provide second-time patterned hardmask 220. The retained photobuckets 222, at this stage, represent the locations where conductive tabs will not be in a final metallization layer. That is, in the second photobucket process, photobuckets are removed from locations where conductive tabs will ultimately be formed. In one embodiment, in order to form locations where conductive tabs will be formed, lithography is used to expose the corresponding photobuckets. The exposed photobuckets may then be removed by a developer.

Figure 2E:
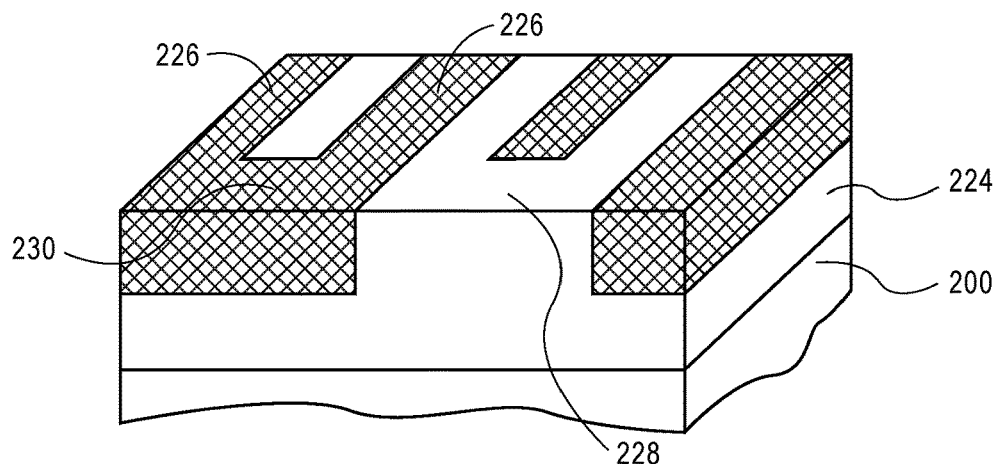

Referring to FIG. 2E, a plug and tab pattern of the second-time patterned hardmask 220 is transferred to the ILD layer 202 to form patterned ILD layer 224. In an embodiment, an etch process is used to transfer the pattern into the ILD layer 202. Several operations may be involved in the pattern transfer, an exemplary scheme for which is described below in association with FIGS. 3H-3K. Following formation of patterned ILD layer 224, conductive lines 226 are formed. In one embodiment, the conductive lines 226 are formed using a metal fill and polish back process. During the formation of conductive lines 226, a conductive tab 230 coupling two metal lines 226 is also formed. Thus, in an embodiment, a conductive coupling (tab 230) between conductive lines 226 is formed at the same time as the conductive lines 226, in a same ILD layer 224, and in a same plane as the conductive lines 226. Additionally, plugs 228 may be formed as a break or interruption in one or more of the conductive lines 226, as is depicted in FIG. 2E. In one such embodiment, the plug 228 is a region of the ILD layer 202 that is preserved during pattern transfer to form patterned ILD layer 224.

The structure of FIG. 2E may subsequently be used as a foundation for forming subsequent metal line/via and ILD layers. Alternatively, the structure of FIG. 2E may represent the final metal interconnect layer in an integrated circuit. It is to be appreciated that the above process operations may be practiced in alternative sequences, not every operation need be performed and/or additional process operations may be performed. Referring again to FIG. 2E, such self-aligned fabrication by a damascene photobucket approach may be continued to fabricate a next metallization layer. Alternatively, other approaches may be used at this stage to provide additional interconnect layers, such as conventional dual or single damascene approaches. In an embodiment, in subsequent fabrication operations, the patterned ILD layer 224 may be removed to provide air gaps between the resulting metal lines 226. It is also to be appreciated that, although not depicted, one or more of the conductive lines 226 may be coupled to an underlying conductive via which may be formed using an additional photobucket operation.

In an embodiment, implementation of a processing scheme such as described above in association with FIGS. 2A-2E may include one or more of: (1) improved density since self-alignment of plugs, tabs, and/or vias can allow interconnects to be placed at higher density, (2) the need for using a metal above or metal below for perpendicular routing is eliminated, freeing up next upper or lower metallization layers for routing other signals, which also can improve density, and/or (3) self-alignment of multiple passes within the same layer can reduce the risk of shorting due to mis-alignment. Other implementations of embodiments described in the above general processing scheme are described below.

A two-dimensional grating approach may be implemented for plugs and tabs (and possibly via) patterning. As an example, FIGS. 3A-3K illustrate angled cross-sectional views representing various operations in a method of fabricating a back end of line (BEOL) metallization layer having a conductive tab coupling metal lines of the metallization layer, in accordance with an embodiment of the present invention.

Figure 3A:
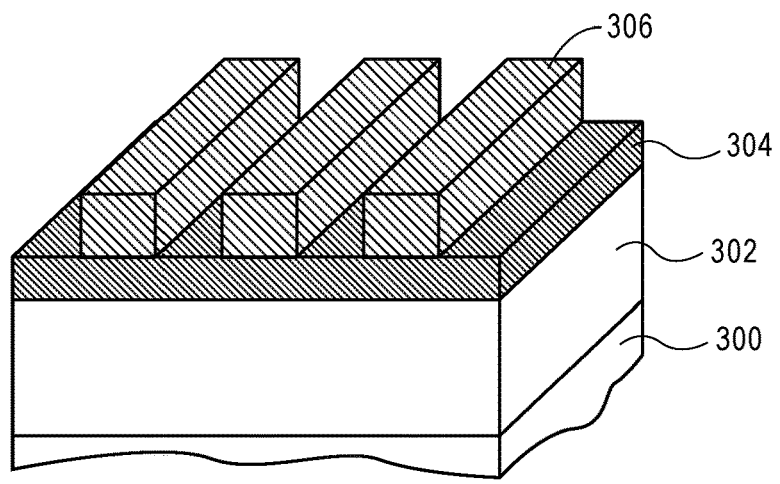
FIGS. 3A-3K illustrate angled cross-sectional views representing various operations in a method of fabricating a back end of line (BEOL) metallization layer having a conductive tab coupling metal lines of the metallization layer, in accordance with an embodiment of the present invention.

Referring to FIG. 3A, a first operation in a cross-grating patterning scheme is performed above an inter-layer dielectric (ILD) layer 302 formed above a substrate 300. A blanket hardmask 304 is first formed on the ILD layer 302. A first grating hardmask 306 is formed along a first direction above the blanket hardmask 304. In an embodiment, the first grating hardmask 306 is formed with a grating pattern, as is depicted in FIG. 3A. In an embodiment, the grating structure of the first grating hardmask 306 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the first grating hardmask 306 of FIG. 3A may have hardmask lines tightly spaced at a constant pitch and having a constant width.

Figure 3B:
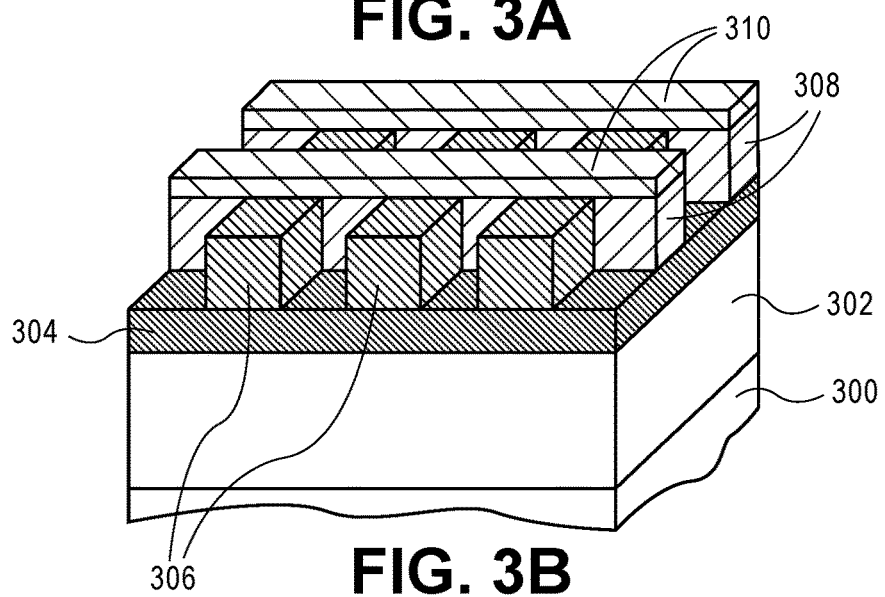

Referring to FIG. 3B, a second operation in a cross-grating patterning scheme is performed above the inter-layer dielectric (ILD) layer 302. A second grating hardmask 308 is formed along a second direction above the blanket hardmask 304. The second direction is orthogonal to the first direction. The second grating hardmask 308 has an overlying hardmask 310 thereon. In an embodiment, the second grating hardmask 310 is fabricated in a patterning process using the overlying hardmask 210. The continuity of the second grating hardmask 308 is broken by lines of the first grating hardmask 306 and, as such, portions of the first grating hardmask 306 extend under the overlying hardmask 310. In an embodiment, the second grating hardmask 308 is formed interleaved with the first grating hardmask 306. In one such embodiment, the second grating hardmask 308 is formed by deposition of a second hardmask material layer having a composition different from the first grating hardmask 306. The second hardmask material layer is then planarized, e.g., by chemical mechanical polishing (CMP), and then patterned using the overlying hardmask 310 to provide the second grating hardmask 308. As was the case for the first grating hardmask 306, in an embodiment, the grating structure of the second grating hardmask 308 is a tight pitch grating structure. In a specific such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second grating hardmask 308 of FIG. 3A may have hardmask lines tightly spaced at a constant pitch and having a constant width.

Figure 3C:
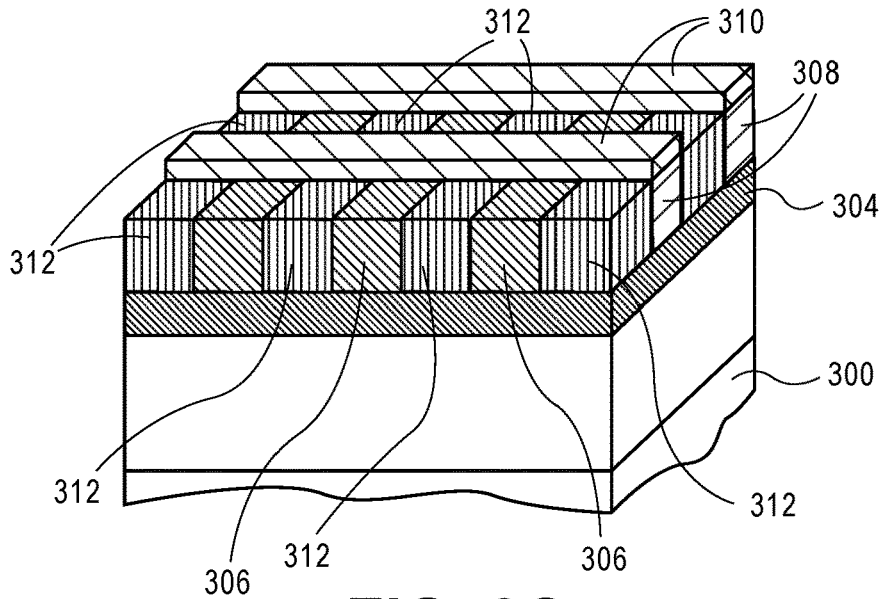

Referring to FIG. 3C, a plug photobucket patterning scheme is performed as a first photobucketing process. In an embodiment, photobuckets 312 are formed on all of the exposed openings between the first grating hardmask 306 and the second grating hardmask 308. In an embodiment, a via patterning process is optionally performed prior to the plug photobucket patterning process. The via patterning may be direct patterning or may involve a separate photobucketing process.

Figure 3D:
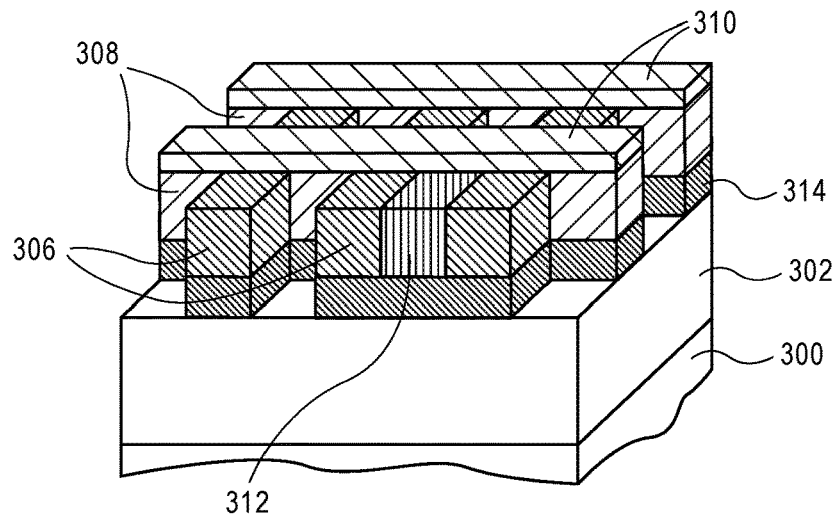

Referring to FIG. 3D, select ones of the photobuckets 312 are removed while other photobuckets 312 are retained, e.g., by not exposing a select photobucket 312 to a lithography and development process used to open all other photobuckets 312. The exposed portions of the blanket hardmask 304 of FIG. 3A are then etched to provide first-time patterned hardmask 314. The retained photobuckets 312, at this stage, represent the plug locations in a final metallization layer. That is, in the first photobucket process, photobuckets are removed from locations where plugs will not be formed. In one embodiment, in order to form locations where plugs will not be formed, lithography is used to expose the corresponding photobuckets. The exposed photobuckets may then be removed by a developer.

Figure 3E:
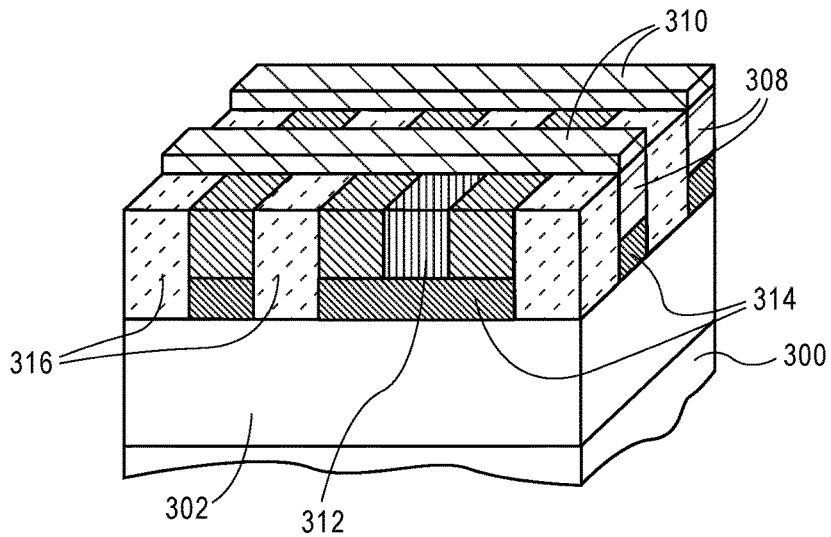

Referring to FIG. 3E, a grating tone reversal process is performed. In an embodiment, dielectric regions 316 is formed in all of the exposed regions of the structure of FIG. 3D. In an embodiment, the dielectric regions 316 are formed by deposition of a dielectric layer and etch back to form dielectric regions 316.

Figure 3F:
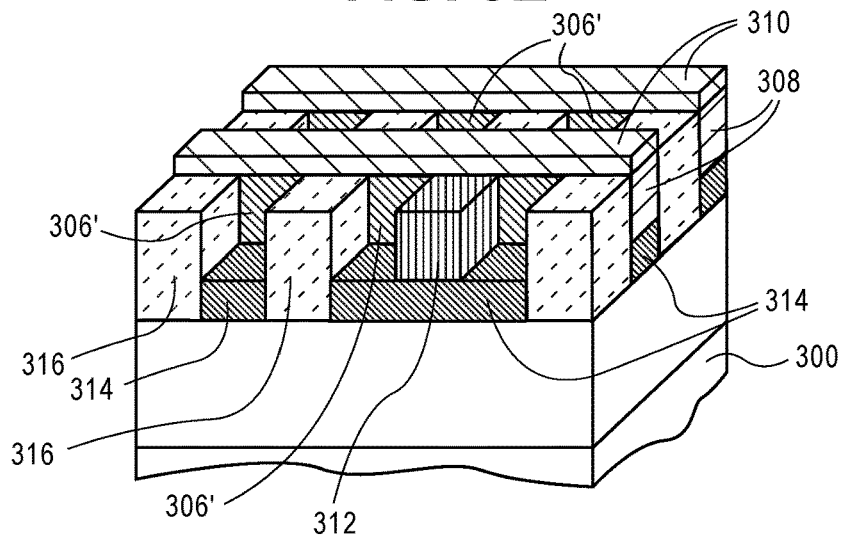

Referring to FIG. 3F, the portions of the first grating hardmask 306 not covered by the overlying hardmask 310 are then removed to leave only portions 306' of the first grating hardmask 306 remaining under the overlying hardmask 310.

Figure 3G:
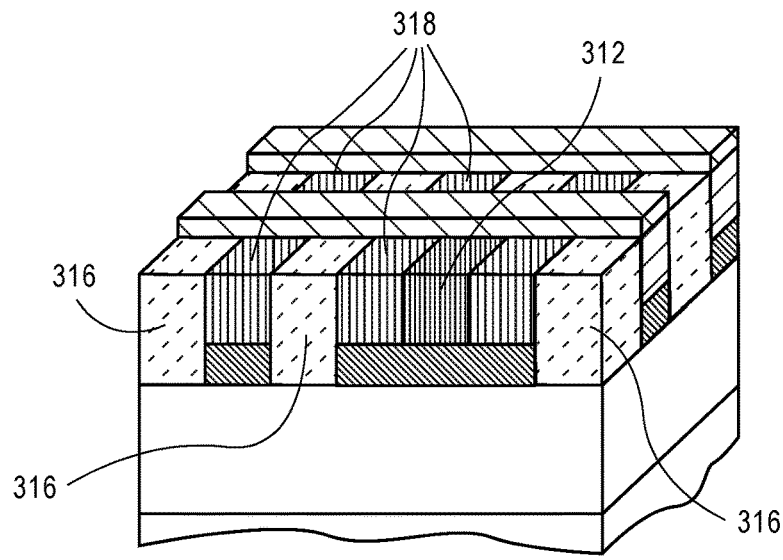

Referring to FIG. 3G, a tab photobucket patterning scheme is performed as a second photobucketing process. In an embodiment, photobuckets 318 are formed in all of the exposed openings formed upon removal of exposed portions of the first grating hardmask 306.

Figure 3H:
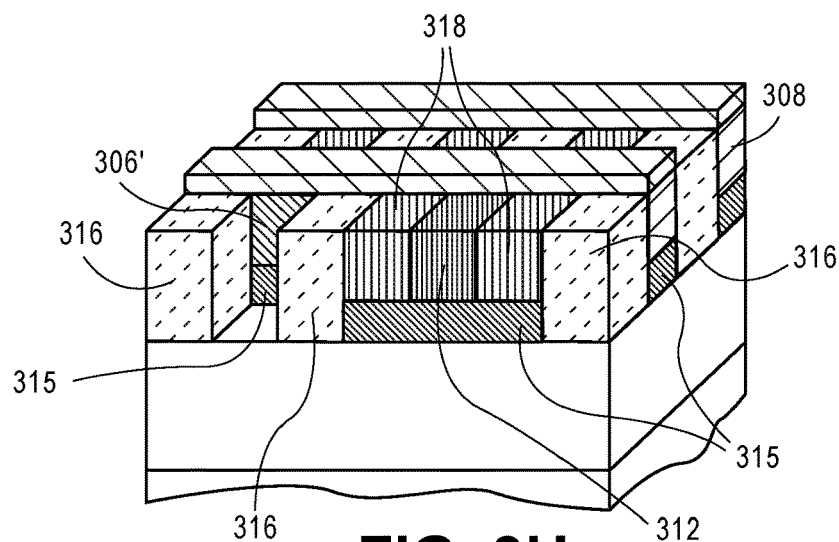

Referring to FIG. 3H, select ones of the photobuckets 318 are removed while other photobuckets 318 are retained, e.g., by not exposing photobuckets 318 to a lithography and development process used to open the other photobuckets. The exposed portions of the first-time patterned hardmask 314 of FIGS. 3D-3G are then etched to provide second-time patterned hardmask 315. The retained photobuckets 318, at this stage, represent the locations where conductive tabs will not be in a final metallization layer. That is, in the second photobucket process, photobuckets are removed from locations where conductive tabs will ultimately be formed. In one embodiment, in order to form locations where conductive tabs will be formed, lithography is used to expose the corresponding photobuckets. The exposed photobuckets may then be removed by a developer.

Figure 3I:
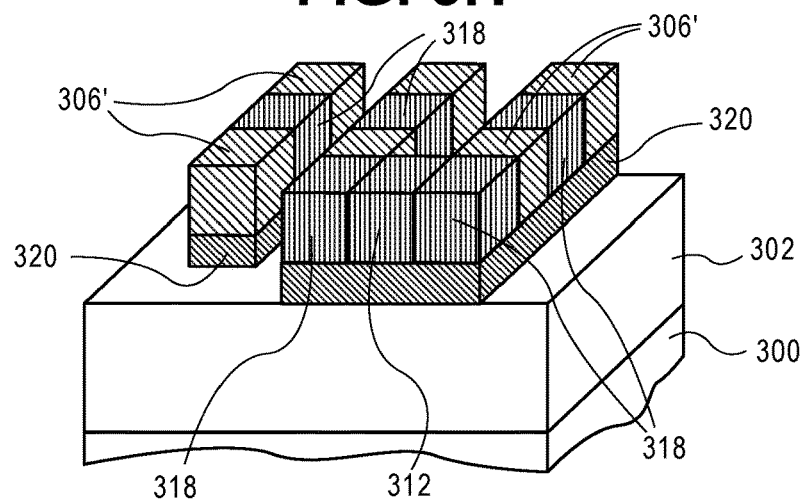

Referring to FIG. 3I, the overlying hardmask 310, the second grating hardmask 308, and the dielectric regions 316 are removed. Subsequently, portions of the second-time patterned hardmask 315 exposed upon removal of the overlying hardmask 310 are removed to provide third-time patterned hardmask 320, the second grating hardmask 308, and the dielectric regions 316 are removed. In an embodiment, remaining ones of the photobuckets 312 and 318 are first hardened (e.g., by a bake process), prior to removing the overlying hardmask 310, the second grating hardmask 308, and the dielectric regions 316. At this stage, select ones of the photobuckets 312, select ones of the photobuckets 318, and retained portions 306' of the first grating hardmask 306 remain above the third-time patterned hardmask 320. In an embodiment, the overlying hardmask 310, the second grating hardmask 308, and the dielectric regions 316 are removed using a selective wet etch process, while the portions of the second-time patterned hardmask 315 exposed upon removal of the overlying hardmask 310 are removed to provide third-time patterned hardmask 320 using a dry etch process.

Figure 3J:
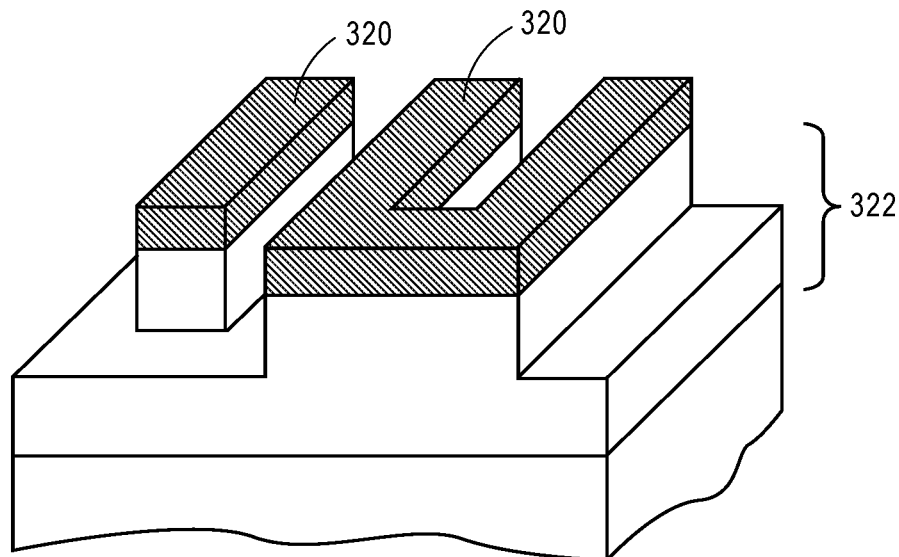

Referring to FIG. 3J, the pattern of the third-time patterned hardmask 320 is transferred to an upper portion of the ILD layer 302 to form patterned ILD layer 322. In an embodiment, then, a plug and tab pattern of the third-time patterned hardmask 320 is transferred to the ILD layer 302 to form patterned ILD layer 322. In an embodiment, an etch process is used to transfer the pattern into the ILD layer 302. In one such embodiment, the select ones of the photobuckets 312, select ones of the photobuckets 318, and retained portions 306' of the first grating hardmask 306 remaining above the third-time patterned hardmask 320 are removed or consumed during the etching used to form patterned ILD layer 322. In another embodiment, the select ones of the photobuckets 312, select ones of the photobuckets 318, and retained portions 306' of the first grating hardmask 306 remaining above the third-time patterned hardmask 320 are removed prior to or subsequent to the etching used to form patterned ILD layer 322.

Figure 3K:
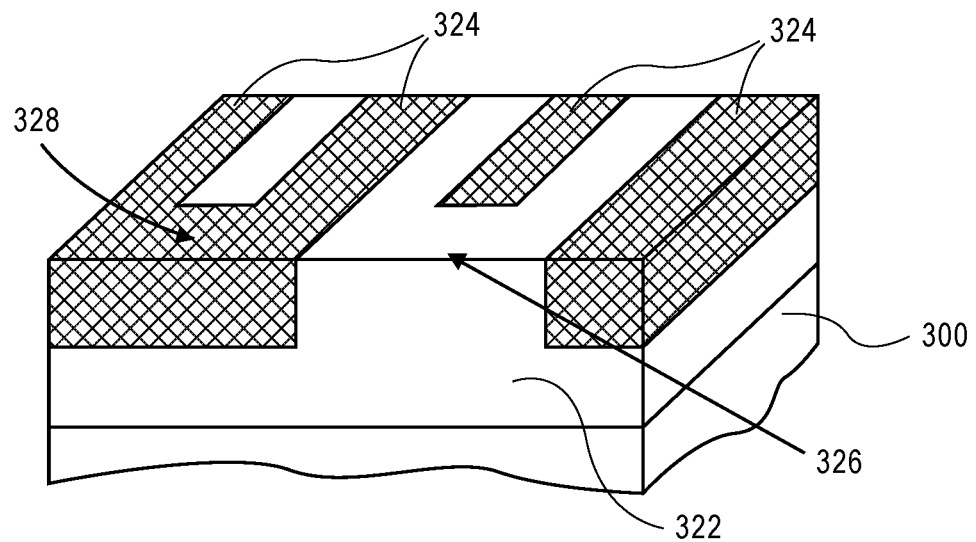

Referring to FIG. 3K, following formation of patterned ILD layer 332, conductive lines 324 are formed. In one embodiment, the conductive lines 324 are formed using a metal fill and polish back process. During the formation of conductive lines 324, a conductive tab 328 coupling two metal lines 324 is also formed. Thus, in an embodiment, a conductive coupling (tab 328) between conductive lines 324 is formed at the same time as the conductive lines 324, in a same ILD layer 322, and in a same plane as the conductive lines 324. Additionally, plugs 326 may be formed as a break or interruption in one or more of the conductive lines 324, as is depicted in FIG. 3K. In one such embodiment, the plug 326 is a region of the ILD layer 302 that is preserved during pattern transfer to form patterned ILD layer 322. In an embodiment, the third-time patterned hardmask 320 is removed, as is depicted in FIG. 3K. In one such embodiment, the third-time patterned hardmask 320 is removed subsequent to forming the conductive lines 324 and tab 328, e.g., using a post metallization chemical mechanical planarization (CMP) process.

Referring again to FIG. 3K, in an embodiment, a back end of line (BEOL) metallization layer for a semiconductor structure includes an inter-layer dielectric (ILD) layer 322 disposed above a substrate 200. A plurality of conductive lines 324 is disposed in the ILD layer 322 along a first direction. A conductive tab 328 is disposed in the ILD layer 322. The conductive tab couples two of the plurality of conductive lines 324 along a second direction orthogonal to the first direction.

Such an arrangement as depicted in FIG. 3K may not otherwise be achievable by conventional lithographic processing at either small pitch, small width, or both. Also, self-alignment may not be achievable with conventional processes. Furthermore, arrangement as depicted in FIG. 3K may not otherwise be achievable in cases where a pitch division scheme is used to ultimately provide a pattern for the conductive lines 324. However, in accordance with an embodiment of the present invention, the plurality of conductive lines 324 has a pitch of 20 nanometers or less. In accordance with another embodiment of the present invention, the plurality of conductive lines 324 each has a width of 10 nanometers or less. In accordance with another embodiment of the present invention, the plurality of conductive lines 324 has a pitch of 20 nanometers or less and each line has a width of 10 nanometers or less.

In an embodiment, the conductive tab 328 is continuous with the two of the plurality of conductive lines, as is depicted in FIG. 3K. In an embodiment, the conductive tab 28 is co-planar with the two of the plurality of conductive lines 324, as is depicted in FIG. 3K. In an embodiment, the BEOL metallization layer further includes a dielectric plug 326 disposed at an end of one of the plurality of conductive lines 324, as is depicted in FIG. 3K. In one embodiment, the dielectric plug 326 is continuous with the ILD layer, as is depicted in FIG. 3K. In one embodiment, although not shown, the BEOL metallization layer further includes a conductive via disposed below and electrically coupled to one of the plurality of conductive lines 324.

The structure of FIG. 3K may subsequently be used as a foundation for forming subsequent metal line/via and ILD layers. Alternatively, the structure of FIG. 3K may represent the final metal interconnect layer in an integrated circuit. It is to be appreciated that the above process operations may be practiced in alternative sequences, not every operation need be performed and/or additional process operations may be performed. Referring again to FIG. 3K, such self-aligned fabrication by a damascene photobucket approach may be continued to fabricate a next metallization layer. Alternatively, other approaches may be used at this stage to provide additional interconnect layers, such as conventional dual or single damascene approaches. In an embodiment, in subsequent fabrication operations, the patterned ILD layer 322 may be removed to provide air gaps between the resulting metal lines 324. It is also to be appreciated that, although not depicted, one or more of the conductive lines 324 may be coupled to an underlying conductive via which may be formed using an additional photobucket operation.

In contrast to a two-dimensional approach, a one-dimensional grating approach may also be implemented for plugs and tabs (and possibly via) patterning. Such a one-dimensional approach provides confinement in only one direction. As such, the pitch may be "tight" in one direction and "loose" in one direction.

Figure 4:
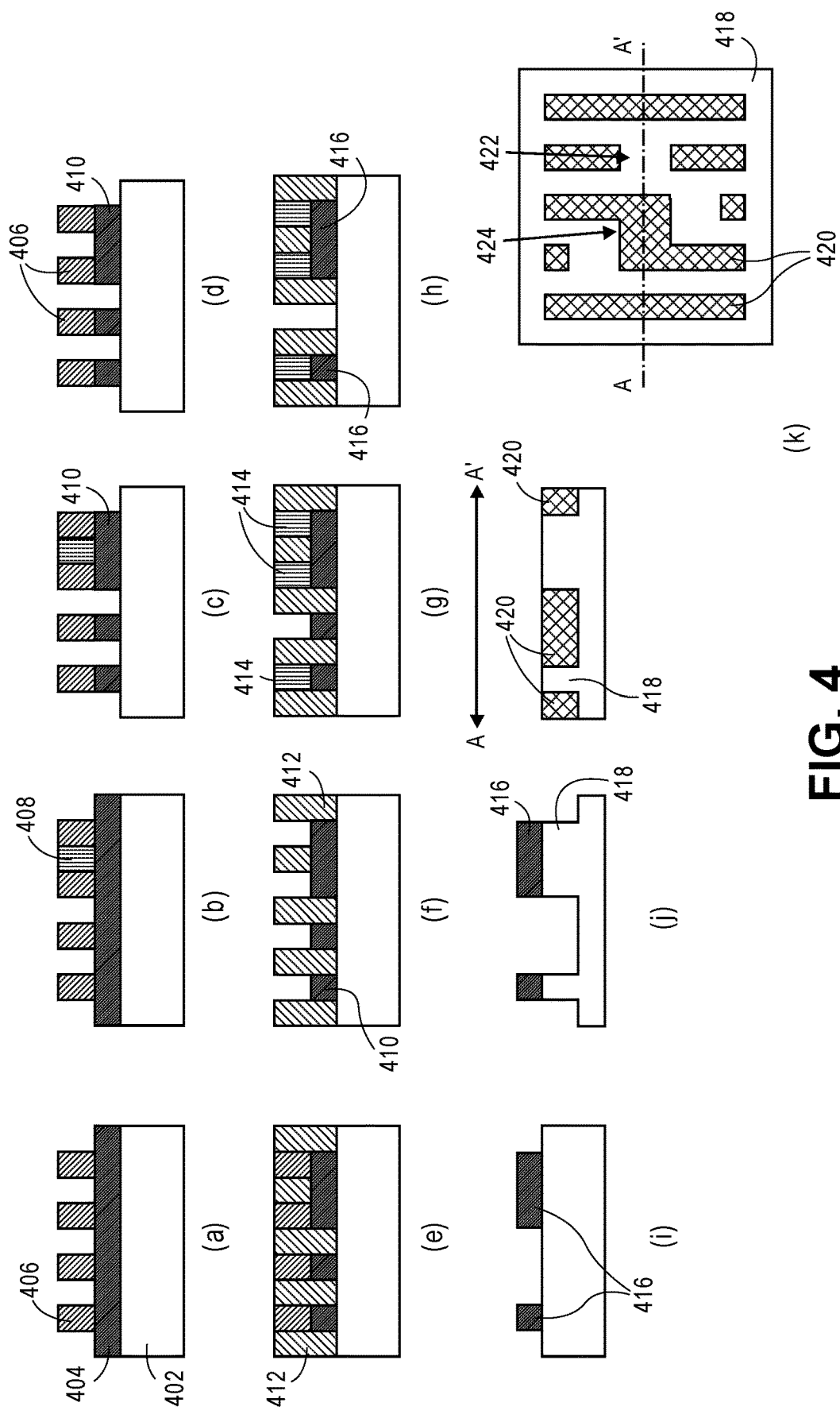
FIG. 4 illustrates cross-sectional views and a plan view representing various operations in another method of fabricating a back end of line (BEOL) metallization layer having a conductive tab coupling metal lines of the metallization layer, in accordance with an embodiment of the present invention.

As a first example of a one-dimensional grating approach for plugs and tabs (and possibly via) patterning, FIG. 4 illustrates cross-sectional views and a plan view representing various operations in another method of fabricating a back end of line (BEOL) metallization layer having a conductive tab coupling metal lines of the metallization layer, in accordance with an embodiment of the present invention.

Referring to part (a) of FIG. 4, a hardmask grating 406 is formed above a blanket hardmask 404 formed above an inter-layer dielectric (ILD) layer 402 (which may be formed above a substrate, not shown). Photobuckets 408 are then formed and selected for dielectric plug patterning, as is depicted in part (b) of FIG. 4. Referring to part (c) of FIG. 4, the blanket hardmask 404 is then patterned to form first-time patterned hardmask layer 410 using the pattern of the hardmask grating 406 and the photobuckets 408, e.g., by an etch process. The photobuckets 408 are then removed, e.g., using an ash process, as is depicted in part (d) of FIG. 4. Referring to part (e) of FIG. 4, a third hardmask 412 such as a silicon oxide hardmask is formed, e.g., using a deposition and recessing process. The hardmask grating 406 is then removed, e.g., by a wet etch process, as is depicted in part (f) of FIG. 4. Referring to part (g) of FIG. 4, photobuckets 414 are then formed and selected for conductive tab patterning. The first-time patterned hardmask layer 410 is then patterned to form second-time patterned hardmask layer 416, as is depicted in part (h) of FIG. 4. Referring to part (i) of FIG. 4, the third hardmask 412 and the photobuckets 414 are then removed to leave only second-time patterned hardmask layer 416 above ILD layer 402. The pattern of the second-time patterned hardmask layer 416 is then transferred to the ILD layer 402 to form patterned ILD layer 418, e.g., by an etch process, as is depicted in part (j) of FIG. 4. Referring to part (k) of FIG. 4, a cross-sectional view and a plan view are shown following a metallization and planarization (e.g., polish) process used to form conductive lines 420, conductive tabs 424 and dielectric plugs 422 and to remove the second-time patterned hardmask layer 416.

The structure of part (k) of FIG. 4 may subsequently be used as a foundation for forming subsequent metal line/via and ILD layers. Alternatively, the structure of part (k) of FIG. 4 may represent the final metal interconnect layer in an integrated circuit. It is to be appreciated that the above process operations may be practiced in alternative sequences, not every operation need be performed and/or additional process operations may be performed. Referring again to part (k) of FIG. 4, such self-aligned fabrication by a damascene photobucket approach may be continued to fabricate a next metallization layer. Alternatively, other approaches may be used at this stage to provide additional interconnect layers, such as conventional dual or single damascene approaches. In an embodiment, in subsequent fabrication operations, the patterned ILD layer 418 may be removed to provide air gaps between the resulting metal lines 420. It is also to be appreciated that, although not depicted, one or more of the conductive lines 420 may be coupled to an underlying conductive via which may be formed using an additional photobucket operation.

Figure 5:
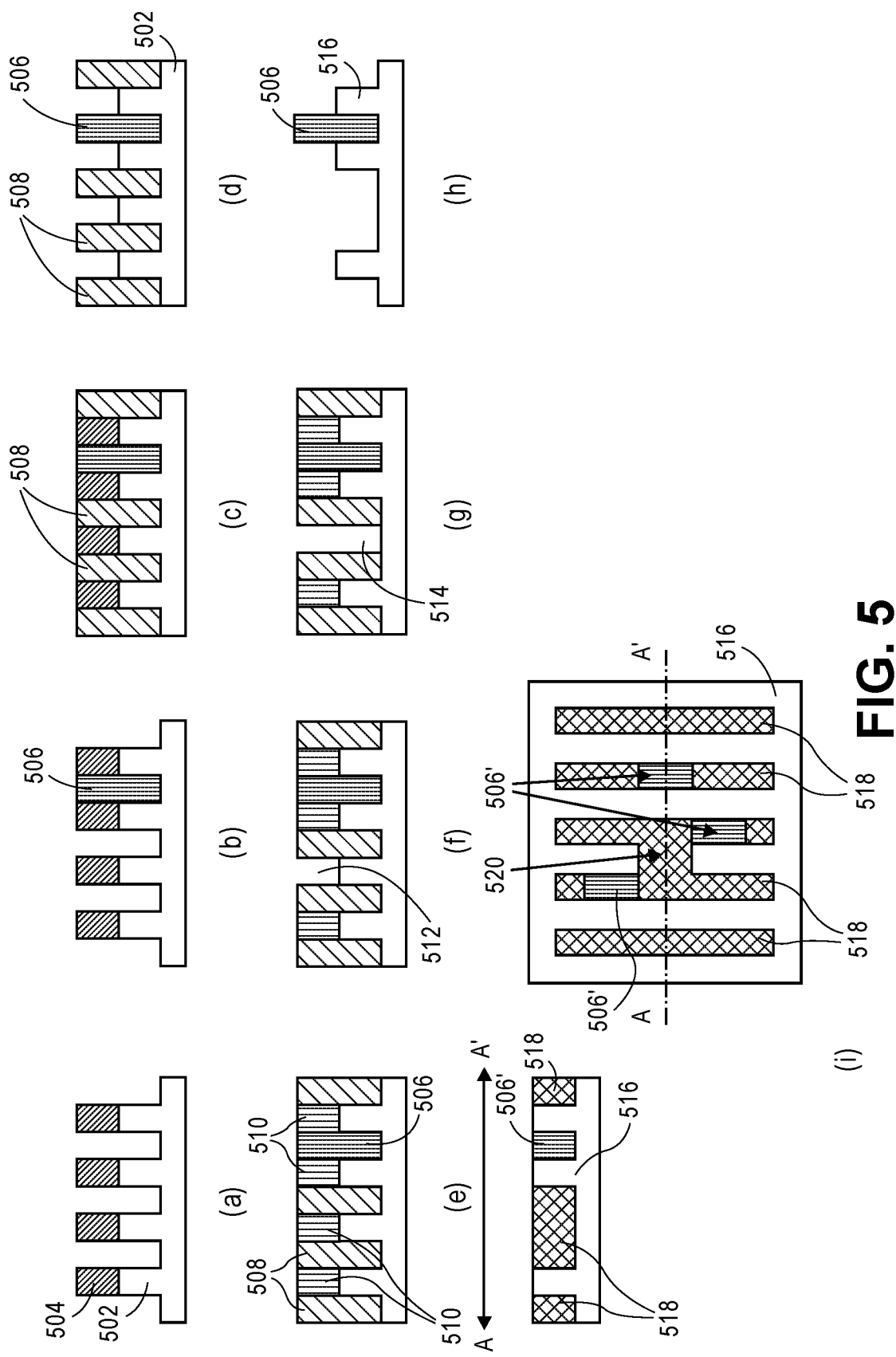
FIG. 5 illustrates cross-sectional views and a plan view representing various operations in another method of fabricating a back end of line (BEOL) metallization layer having a conductive tab coupling metal lines of the metallization layer, in accordance with an embodiment of the present invention.

As a second example of a one-dimensional grating approach for plugs and tabs (and possibly via) patterning, FIG. 5 illustrates cross-sectional views and a plan view representing various operations in another method of fabricating a back end of line (BEOL) metallization layer having a conductive tab coupling metal lines of the metallization layer, in accordance with an embodiment of the present invention.

Referring to part (a) of FIG. 5, a hardmask grating 504 is formed above and used to pattern an inter-layer dielectric (ILD) layer to form patterned ILD layer 502 (which may be formed above a substrate, not shown). Photobuckets 506 are then formed and selected for dielectric plug patterning, as is depicted in part (b) of FIG. 5. In an embodiment, the photobuckets 506 are formed of a permanent resist material, e.g., a material that is or can later be converted to a permanent ILD layer. Referring to part (c) of FIG. 5, a hardmask 508 is formed. The hardmask grating 504 is then removed, e.g., by a wet etch process, as is depicted in part (d) of FIG. 5. Referring to part (e) of FIG. 5, photobuckets 510 are then formed and selected for conductive tab patterning. Select ones of the photobuckets 510 are then removed to form openings 512, as is depicted in part (f) of FIG. 5. Referring to part (g) of FIG. 5, the pattern of the opening 512 is then transferred into the patterned ILD layer 502 to form conductive tab locations 514. The remaining photobuckets 510 and the hardmask 508 are then removed to provide patterned ILD layer 516, as is depicted in part (h) of FIG. 5. Referring to part (i) of FIG. 5, a cross-sectional view and a plan view are shown following a metallization and planarization (e.g., polish) process used to form conductive lines 518, conductive tabs 520 and dielectric plugs 506' in the patterned ILD layer 516.

As mentioned above, the photobuckets 506 may be of or may ultimately form a permanent dielectric layer that remains in the final structure. In one such embodiment, the permanent photobucket material is different from the material of the ILD layer 516. In another embodiment, the permanent photobucket material is the same as the material of the ILD layer 516. In either case, in a specific embodiment, a distinction such as a vertical seam between the materials of dielectric plugs 506' and the patterned ILD layer 516 may be observed in the final structure.

The structure of part (i) of FIG. 5 may subsequently be used as a foundation for forming subsequent metal line/via and ILD layers. Alternatively, the structure of part (i) of FIG. 5 may represent the final metal interconnect layer in an integrated circuit. It is to be appreciated that the above process operations may be practiced in alternative sequences, not every operation need be performed and/or additional process operations may be performed. Referring again to part (i) of FIG. 5, such self-aligned fabrication by a damascene photobucket approach may be continued to fabricate a next metallization layer. Alternatively, other approaches may be used at this stage to provide additional interconnect layers, such as conventional dual or single damascene approaches. In an embodiment, in subsequent fabrication operations, the patterned ILD layer 516 (and possibly material 506') may be removed to provide air gaps between the resulting metal lines 518. It is also to be appreciated that, although not depicted, one or more of the conductive lines 518 may be coupled to an underlying conductive via which may be formed using an additional photobucket operation.

Figure 6:
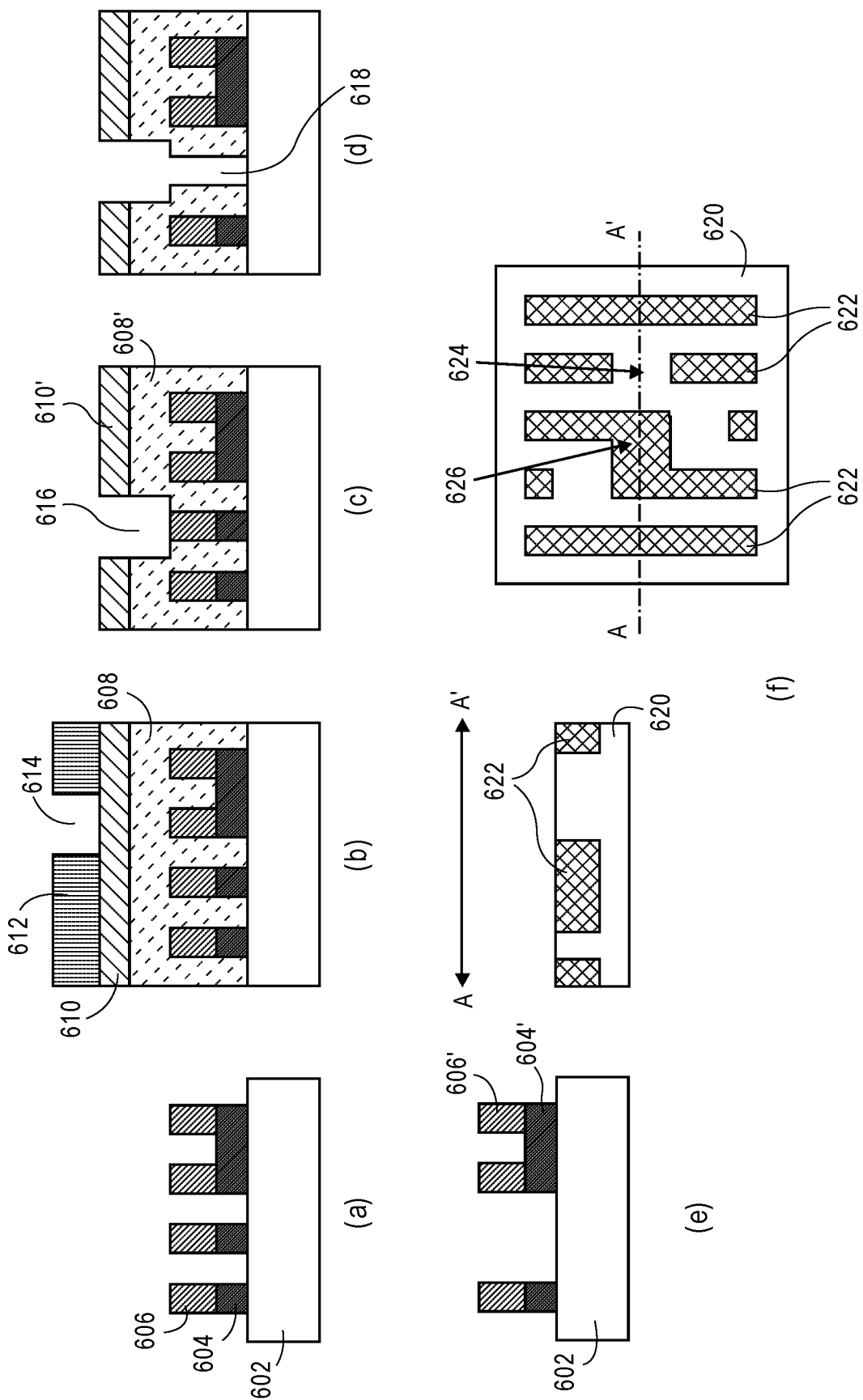
FIG. 6 illustrates cross-sectional views and a plan view representing various operations in another method of fabricating a back end of line (BEOL) metallization layer having a conductive tab coupling metal lines of the metallization layer, in accordance with an embodiment of the present invention.

As an example of a one-dimensional approach involving tab patterning using conventional lithography (e.g., to define where in grating tab is desired), FIG. 6 illustrates cross-sectional views and a plan view representing various operations in another method of fabricating a back end of line (BEOL) metallization layer having a conductive tab coupling metal lines of the metallization layer, in accordance with an embodiment of the present invention.

Referring to part (a) of FIG. 6, a second hardmask grating 606 is formed above a hardmask 604 with plug patterning above an inter-layer dielectric (ILD) layer 602 (which may be formed above a substrate, not shown). A trilayer mask deposition of layers 608 (e.g., a carbon hardmask layer), 610 (e.g., a silicon anti-reflective coating (ARC) layer) and 612 (e.g., a photoresist layer) is then formed with an opening 614 patterned in the layer 612, as is depicted in part (b) of FIG. 6. Referring to part (c) of FIG. 6, a portion of the layer 608 and a portion of the layer 610 is patterned through opening 614 to provide an opening 616 in patterned layer 608' and patterned layer 610'. A portion of the hardmask layer 604 is then removed to form patterned hardmask 604', as is depicted in part (d) of FIG. 6. Referring to part (e) of FIG. 6, the remaining portions of the trilayer stack is removed to provide patterned hardmask 604' and patterned hardmask 606' above ILD layer 602. The pattern of the patterned hardmask 604' is then transferred to the ILD layer 602 to form patterned ILD layer 620, e.g., by an etch process, as is depicted in part (0 of FIG. 6. Referring again to part (0 of FIG. 6, a cross-sectional view and a plan view are shown following a metallization and planarization (e.g., polish) process used to form conductive lines 622, conductive tabs 626 and dielectric plugs 624 and to remove the patterned hardmask layer 604'.

The structure of part (f) of FIG. 6 may subsequently be used as a foundation for forming subsequent metal line/via and ILD layers. Alternatively, the structure of part (f) of FIG. 6 may represent the final metal interconnect layer in an integrated circuit. It is to be appreciated that the above process operations may be practiced in alternative sequences, not every operation need be performed and/or additional process operations may be performed. Referring again to part (f) of FIG. 6, such self-aligned fabrication by a damascene photobucket approach may be continued to fabricate a next metallization layer. Alternatively, other approaches may be used at this stage to provide additional interconnect layers, such as conventional dual or single damascene approaches. In an embodiment, in subsequent fabrication operations, the patterned ILD layer 620 may be removed to provide air gaps between the resulting metal lines 622. It is also to be appreciated that, although not depicted, one or more of the conductive lines 622 may be coupled to an underlying conductive via which may be formed using an additional photobucket operation.

Implementation of one or more of the above processing schemes may enable patterning interconnects at tight pitch. Some embodiments have a leave-behind material which is detectable. For example, in the embodiment described in association with FIG. 5, a leave-behind plug material may be retained in between two interconnect lines. Furthermore, the above described patterning schemes can provide for structures that have self-alignment of plugs, vias, and tabs that can be difficult to achieve by a different fabrication approach.

Overall, in accordance with one or more embodiments of the present invention, approaches described herein involve use of photobucket interlayer dielectric (ILD) to select locations for plugs, tabs, and possibly vias. The photobucket ILD composition is typically very different from standard ILD and, in one embodiment, is perfectly self-aligned in both directions. More generally, in an embodiment, the term "photobucket" as used herein involves use of an ultrafast photoresist or ebeam resist or other photosensitive material as formed in etched openings. In one such embodiment, a thermal reflow of a polymer into the openings is used following a spin coat application. In one embodiment, the fast photoresist is fabricated by removing a quencher from an existing photoresist material. In another embodiment, the photobuckets are formed by an etch-back process and/or a lithography/shrink/etch process. It is to be understood that the photobuckets need not be filled with actual photoresist, so long as the material acts as a photosensitive switch. In one embodiment, lithography is used to expose the corresponding photobuckets that are selected for removal. However, the lithographic constraints may be relaxed and misalignment tolerance may be high since the photobuckets are surrounded by non-photolyzable materials. Furthermore, in an embodiment, instead of exposing at, e.g. 30 mJ/cm$^2$, such photobuckets might be exposed at, e.g., 3 mJ/cm$^2$. Normally this would result in very poor critical dimension (CD) control and roughness. But in this case, the CD and roughness control will be defined by the photobuckets, which can be very well controlled and defined. Thus, the photobucket approach may be used to circumvent imaging/dose tradeoff which limits the throughput of next generation lithographic processes. In one embodiment, the photobuckets are subject to exposure of extreme ultraviolet (EUV) light in order to expose the photobuckets, where in a particular embodiment, EUV exposure is in the range of 5-15 nanometers.

To provide further context relevant for implementations described herein, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned tabs, plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor for the resulting structures described herein.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

In an embodiment, as is also used throughout the present description, hardmask materials (and in some instances plug material layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIGS. 1B, 2A-2E, 3A-3K, 4, 5 and 6 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIGS. 1B, 2E, 3K, 4 (part (k)), 5 (part (i)) and 6 (part (f)) may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc. In other embodiments, the pitch does not need to be constant, nor does the width.

Figure 7A:
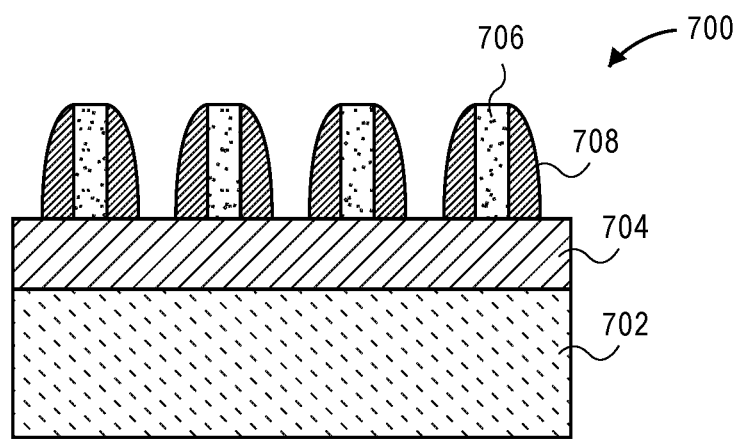
FIG. 7A illustrates a cross-sectional view of a starting structure following deposition, but prior to patterning, of a hardmask material layer formed on an interlayer dielectric (ILD) layer, in accordance with an embodiment of the present invention.
Figure 7B:
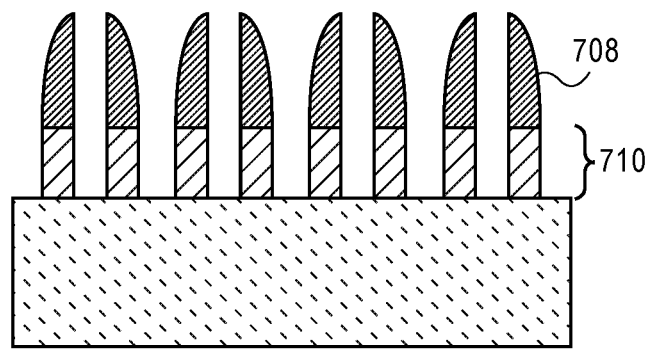
FIG. 7B illustrates a cross-sectional view of the structure of FIG. 7A following patterning of the hardmask layer by pitch halving, in accordance with an embodiment of the present invention.

In an embodiment, pitch division techniques are used to increase a line density. In a first example, pitch halving can be implemented to double the line density of a fabricated grating structure. FIG. 7A illustrates a cross-sectional view of a starting structure following deposition, but prior to patterning, of a hardmask material layer formed on an interlayer dielectric (ILD) layer. FIG. 7B illustrates a cross-sectional view of the structure of FIG. 7A following patterning of the hardmask layer by pitch halving.

Referring to FIG. 7A, a starting structure 700 has a hardmask material layer 704 formed on an interlayer dielectric (ILD) layer 702. A patterned mask 706 is disposed above the hardmask material layer 704. The patterned mask 706 has spacers 708 formed along sidewalls of features (lines) thereof, on the hardmask material layer 704.

Referring to FIG. 7B, the hardmask material layer 704 is patterned in a pitch halving approach. Specifically, the patterned mask 706 is first removed. The resulting pattern of the spacers 708 has double the density, or half the pitch or the features of the mask 706. The pattern of the spacers 708 is transferred, e.g., by an etch process, to the hardmask material layer 704 to form a patterned hardmask 710, as is depicted in FIG. 7B. In one such embodiment, the patterned hardmask 710 is formed with a grating pattern having unidirectional lines. The grating pattern of the patterned hardmask 710 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 710 of FIG. 7B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 8:
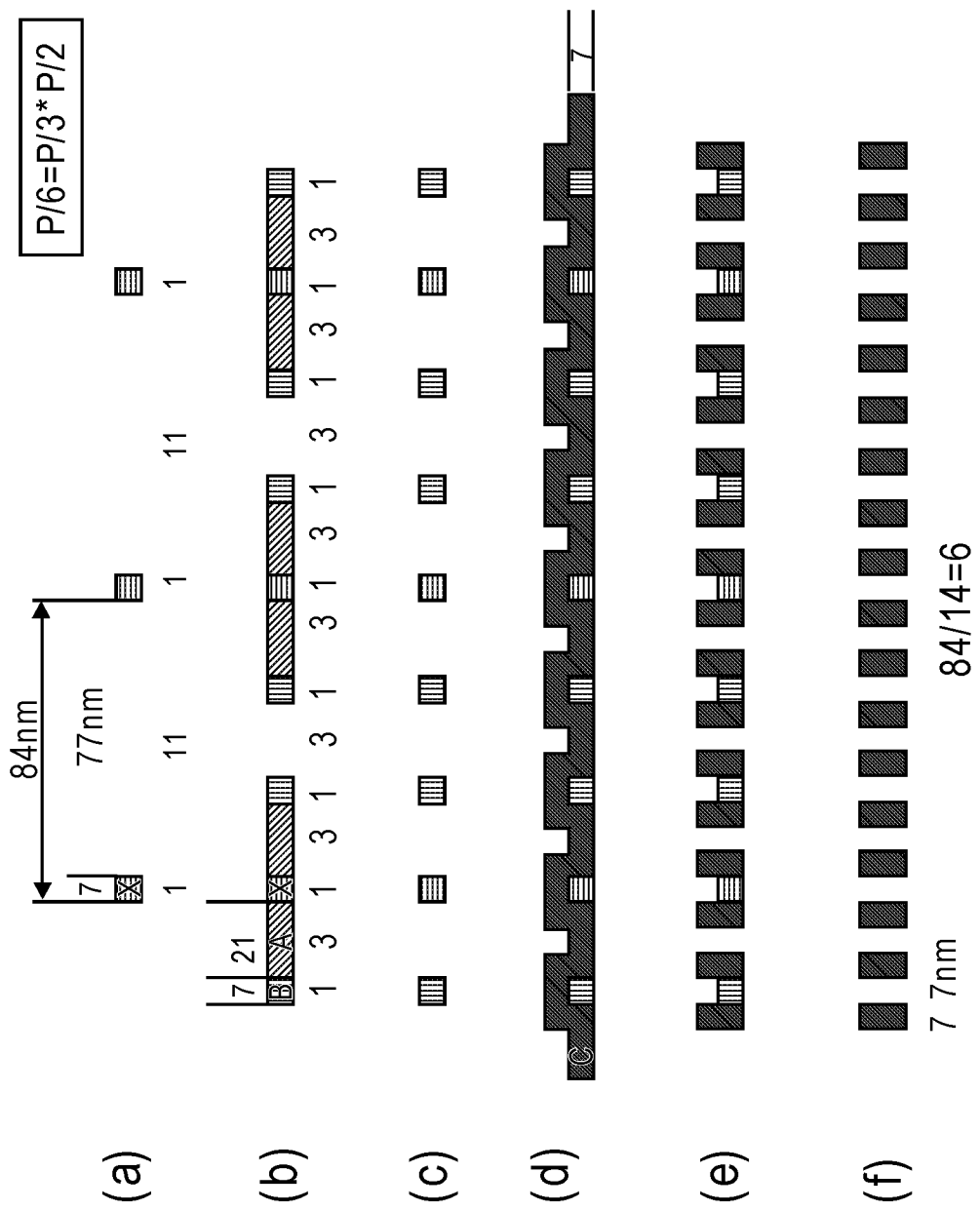
FIG. 8 illustrates cross-sectional views in a spacer-based-sextuple-patterning (SBSP) processing scheme which involves pitch division by a factor of six, in accordance with an embodiment of the present invention.

It is to be appreciated that other pitch division approaches may also be implemented. For example, FIG. 8 illustrates cross-sectional views in a spacer-based-sextuple-patterning (SBSP) processing scheme which involves pitch division by a factor of six. Referring to FIG. 8, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc.

Each of the processor, the memory, and the chipset, may potentially be manufactured using the approaches disclosed herein.

Figure 9:
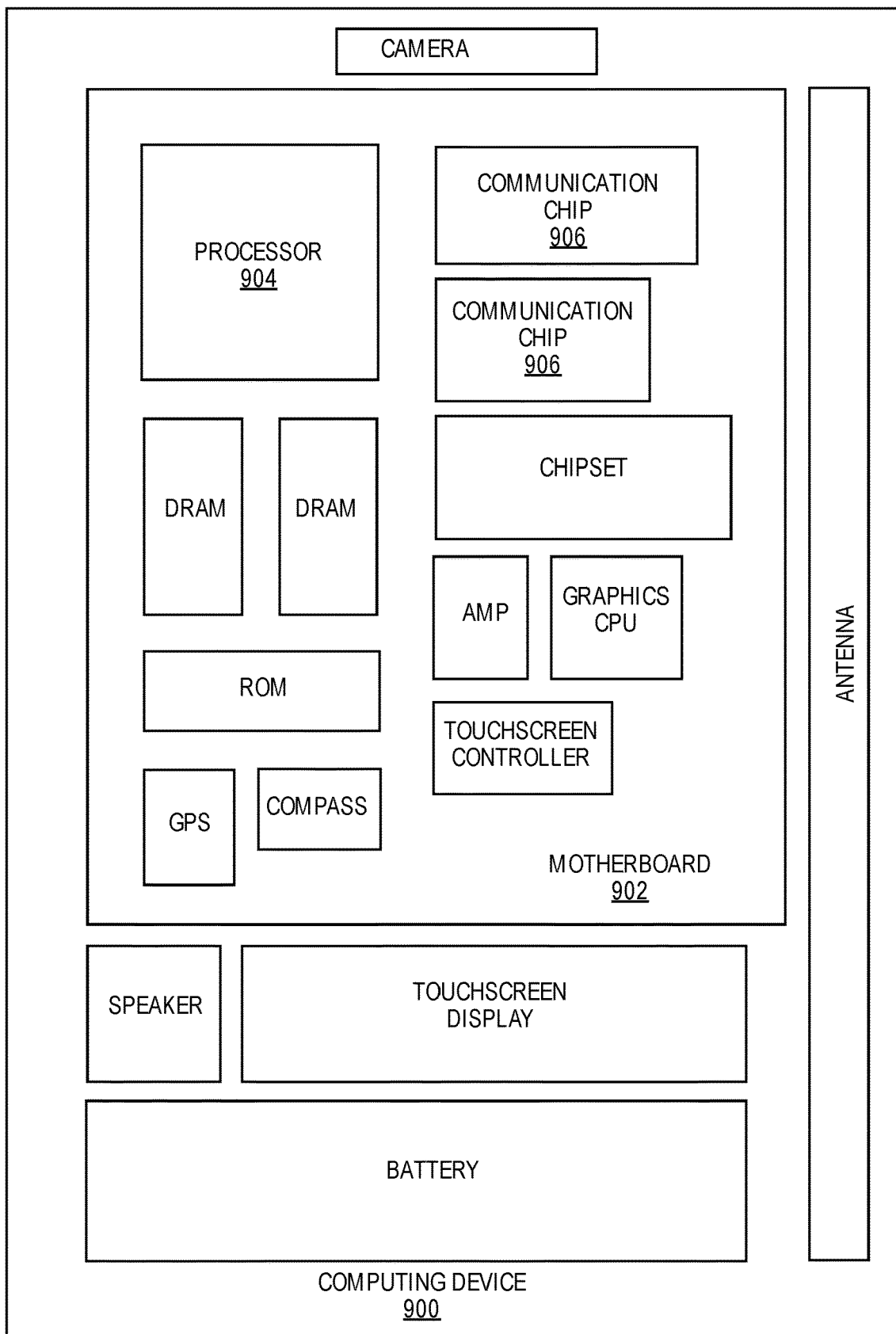
FIG. 9 illustrates a computing device in accordance with one implementation of an embodiment of the present invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of embodiments of the invention, the integrated circuit die of the processor includes one or more structures, such as BEOL metallization layers, built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more structures, such as BEOL metallization layers, built in accordance with implementations of the invention.

In further implementations, another component housed within the computing device 900 may contain an integrated circuit die that includes one or more structures, such as BEOL metallization layers, built in accordance with implementations of embodiments of the invention.

In various implementations, the computing device 900 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
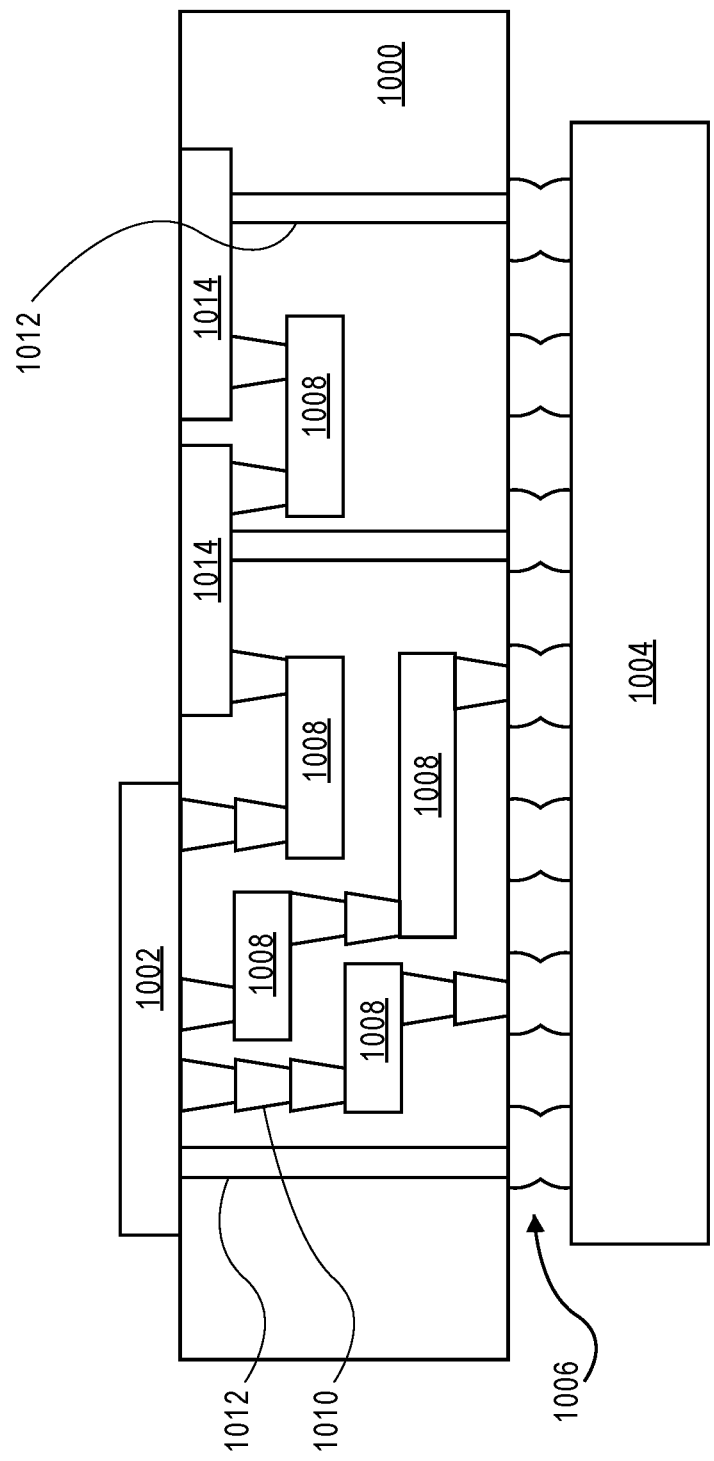
FIG. 10 is an interposer implementing one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the invention, apparatuses or processes disclosed herein may be used in the fabrication of interposer 1000.

Thus, embodiments of the present invention include damascene plug and tab patterning with photobuckets for back end of line (BEOL) spacer-based interconnects.

In an embodiment, a back end of line (BEOL) metallization layer for a semiconductor structure includes an interlayer dielectric (ILD) layer disposed above a substrate. A plurality of conductive lines is disposed in the ILD layer along a first direction. The plurality of conductive lines has a pitch of 20 nanometers or less. A conductive tab is disposed in the ILD layer. The conductive tab couples two of the plurality of conductive lines along a second direction orthogonal to the first direction.

In one embodiment, the conductive tab is continuous with the two of the plurality of conductive lines.

In one embodiment, the conductive tab is co-planar with the two of the plurality of conductive lines.

In one embodiment, the BEOL metallization layer further includes a dielectric plug disposed at an end of one of the plurality of conductive lines.

In one embodiment, the dielectric plug is continuous with the ILD layer.

In one embodiment, the BEOL metallization layer further includes a conductive via disposed above or below and electrically coupled to one of the plurality of conductive lines.

In an embodiment, a back end of line (BEOL) metallization layer for a semiconductor structure includes an inter-layer dielectric (ILD) layer disposed above a substrate. A plurality of conductive lines is disposed in the ILD layer along a first direction. The plurality of conductive lines each have a width of 10 nanometers or less. A conductive tab is disposed in the ILD layer. The conductive tab couples two of the plurality of conductive lines along a second direction orthogonal to the first direction.

In one embodiment, the conductive tab is continuous with the two of the plurality of conductive lines.

In one embodiment, the conductive tab is co-planar with the two of the plurality of conductive lines.

In one embodiment, the BEOL metallization layer further includes a dielectric plug disposed at an end of one of the plurality of conductive lines.

In one embodiment, the dielectric plug is continuous with the ILD layer.

In one embodiment, the BEOL metallization layer further includes a conductive via disposed above or below and electrically coupled to one of the plurality of conductive lines.

In an embodiment, a method of fabricating a back end of line (BEOL) metallization layer for a semiconductor structure includes forming an inter-layer dielectric (ILD) layer above a substrate. The method also includes forming a first plurality of photobuckets above the ILD layer. The first plurality of photobuckets defines all possible dielectric plug locations for the BEOL metallization layer. The method also includes removing fewer than all of the first plurality of photobuckets and retaining one or more of the first plurality of photobuckets in select dielectric plug locations. The method also includes forming a second plurality of photobuckets above the ILD layer. The second plurality of photobuckets defines all possible conductive tab locations for the BEOL metallization layer. The method also includes removing fewer than all of the second plurality of photobuckets in select conductive tab locations and retaining one or more of the second plurality of photobuckets. The method also includes, subsequent to removing fewer than all of the first plurality of photobuckets and removing fewer than all of the second plurality of photobuckets, transferring an image including the select dielectric plug locations and the select conductive tab locations to the ILD layer. The method also includes forming a plurality of conductive lines, one or more dielectric plugs, and one or more conductive tabs in the ILD layer.

In one embodiment, the first and second pluralities of photobuckets are formed in a two-dimensional hardmask grating structure formed above the ILD layer.

In one embodiment, the method further includes performing a tone reversal process operation between forming the first and second pluralities of photobuckets.

In one embodiment, the first and second pluralities of photobuckets are formed in a one-dimensional hardmask grating structure formed above the ILD layer.

In one embodiment, forming the one or more dielectric plugs includes forming a same dielectric material the ILD layer.

In one embodiment, the one or more dielectric plugs are continuous with the ILD layer.

In one embodiment, forming the one or more dielectric plugs includes forming a different dielectric material the ILD layer.

In one embodiment, forming the one or more conductive tabs includes forming the one or more conductive tabs continuous with the plurality of conductive lines.

What is claimed is:

1. A back end of line (BEOL) metallization layer for a semiconductor structure, the BEOL metallization layer comprising:
    an inter-layer dielectric (ILD) layer disposed above a substrate, the substrate having a top surface;
    a plurality of conductive lines disposed in the ILD layer along a first direction, the plurality of conductive lines having a pitch of 20 nanometers or less, wherein each of the plurality of conductive lines has a longest dimension along the first direction, and wherein the longest dimension of each of the plurality of conductive lines is parallel with one another; and
    a conductive tab disposed in the ILD layer, the conductive tab coupling two of the plurality of conductive lines along a second direction orthogonal to the first direction, wherein the first direction and the second direction are parallel with the top surface of the substrate.

2. The BEOL metallization layer of claim 1, wherein the conductive tab is continuous with the two of the plurality of conductive lines.

3. The BEOL metallization layer of claim 1, wherein the conductive tab is co-planar with the two of the plurality of conductive lines.

4. The BEOL metallization layer of claim 1, further comprising:
    a dielectric plug disposed at an end of one of the plurality of conductive lines.

5. The BEOL metallization layer of claim 4, wherein the dielectric plug is continuous with the ILD layer.

6. The BEOL metallization layer of claim 1, further comprising:
    a conductive via disposed above or below and electrically coupled to one of the plurality of conductive lines.

7. A back end of line (BEOL) metallization layer for a semiconductor structure, the BEOL metallization layer comprising:
    an inter-layer dielectric (ILD) layer disposed above a substrate, the substrate having a top surface;
    a plurality of conductive lines disposed in the ILD layer along a first direction, the plurality of conductive lines each having a width of 10 nanometers or less, wherein each of the plurality of conductive lines has a longest dimension along the first direction, and wherein the longest dimension of each of the plurality of conductive lines is parallel with one another; and
    a conductive tab disposed in the ILD layer, the conductive tab coupling two of the plurality of conductive lines along a second direction orthogonal to the first direction, wherein the first direction and the second direction are parallel with the top surface of the substrate.

8. The BEOL metallization layer of claim 7, wherein the conductive tab is continuous with the two of the plurality of conductive lines.

9. The BEOL metallization layer of claim 7, wherein the conductive tab is co-planar with the two of the plurality of conductive lines.

10. The BEOL metallization layer of claim 7, further comprising:
a dielectric plug disposed at an end of one of the plurality of conductive lines.

11. The BEOL metallization layer of claim 10, wherein the dielectric plug is continuous with the ILD layer.

12. The BEOL metallization layer of claim 7, further comprising:
a conductive via disposed above or below and electrically coupled to one of the plurality of conductive lines.

13. A computing device, comprising:
a board; and
a component coupled to the board, the component including an integrated circuit structure comprising a back end of line (BEOL) metallization layer, the BEOL metallization layer comprising:
an inter-layer dielectric (ILD) layer disposed above a substrate, the substrate having a top surface;
a plurality of conductive lines disposed in the ILD layer along a first direction, the plurality of conductive lines having a pitch of 20 nanometers or less, wherein each of the plurality of conductive lines has a longest dimension along the first direction, and wherein the longest dimension of each of the plurality of conductive lines is parallel with one another; and
a conductive tab disposed in the ILD layer, the conductive tab coupling two of the plurality of conductive lines along a second direction orthogonal to the first direction, wherein the first direction and the second direction are parallel with the top surface of the substrate.

14. The computing device of claim 13, further comprising:
a memory coupled to the board.

15. The computing device of claim 13, further comprising:
a communication chip coupled to the board.

16. The computing device of claim 13, further comprising:
a camera coupled to the board.

17. The computing device of claim 13, further comprising:
a battery coupled to the board.

18. The computing device of claim 13, further comprising:
an antenna coupled to the board.

19. The computing device of claim 13, wherein the component is selected from the group consisting of a processor, a communications chip, and a digital signal processor.

20. The computing device of claim 13, wherein the computing device is selected from the group consisting of a mobile phone, a laptop, a desk top computer, a server, and a set-top box.

* * * * *